United States Patent [19]

Boss et al.

[11] Patent Number: 5,024,720
[45] Date of Patent: Jun. 18, 1991

[54] FEEDING APPARATUS FOR FEEDING BELTED COMPONENTS TO AN AUTOMATIC ASSEMBLY APPARATUS

[75] Inventors: Ernst Boss, Langenthal; Andreas R. Dill, Riedholzplatz; Heinz Zimmermann, Aetigkofen, all of Switzerland

[73] Assignee: Zevatech AG, Roemerstrasse, Switzerland

[21] Appl. No.: 433,486

[22] Filed: Nov. 8, 1989

[51] Int. Cl.$^5$ .............................................. B65H 5/28
[52] U.S. Cl. .................................... 156/584; 156/344; 221/71
[58] Field of Search .................... 221/71; 156/64, 344, 156/584

[56] References Cited

U.S. PATENT DOCUMENTS

| | | | |
|---|---|---|---|
| 4,653,664 | 3/1987 | Hineno et al. | 221/74 X |
| 4,820,369 | 4/1989 | Kubo | 156/344 |
| 4,915,770 | 4/1990 | Haeda et al. | 221/71 X |
| 4,943,342 | 7/1990 | Golemon | 156/584 |

Primary Examiner—Michael W. Ball
Assistant Examiner—Mark A. Osele
Attorney, Agent, or Firm—Lyon & Lyon

[57] ABSTRACT

The feeding apparatus comprises a flat housing mounted on the component insertion apparatus in vertical orientation. The housing includes a guiding channel for guiding the supporting tape of the belt containing the components to be fed. The guiding channel comprises a channel portion running horizontally along the upper narrow edge of the housing and has a freely exposed component pick-up area.

Driving means are provided for stepwise forwarding the belt through the guiding channel, said driving means mounted in the interior of the housing and including a driving motor.

The driving motor has a drive shaft running parallel to the two lateral surfaces of the housing. First and a second power transmission means are fixed to the drive shaft and adapted to stepwise forward the belt containing the components, and to forward the cover tape when it is peeled off from the belt.

The means for peeling off the cover tape from the belt comprise a deflection means having an oblique deflection edge located in the horizontally running channel portion above said guiding channel, and further having a deflection pulley with a horizontally extending rotation shaft.

The cover tape of the belt is peeled off from the belt over the deflection edge in horizontal direction and perpendicularly to the forwarding direction of the belt and runs over the deflection pulley to be removed in downward direction.

6 Claims, 9 Drawing Sheets

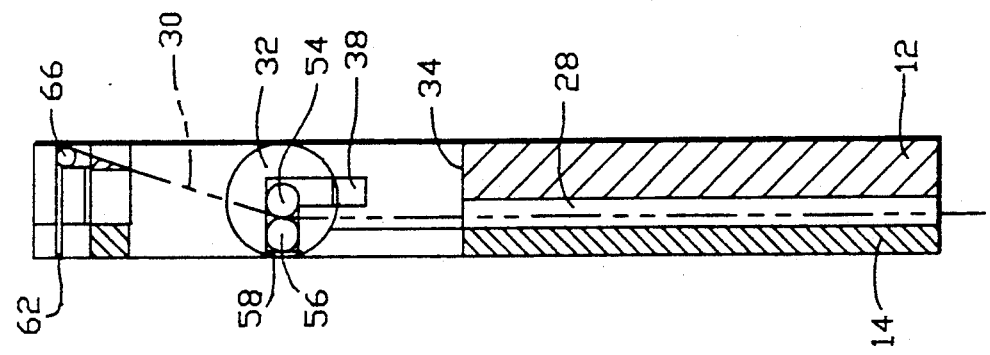
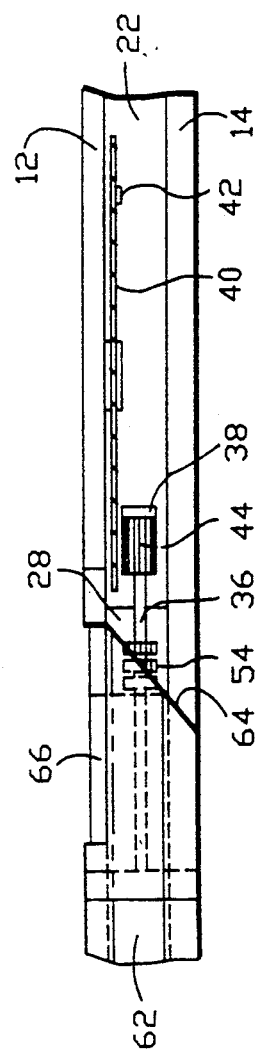
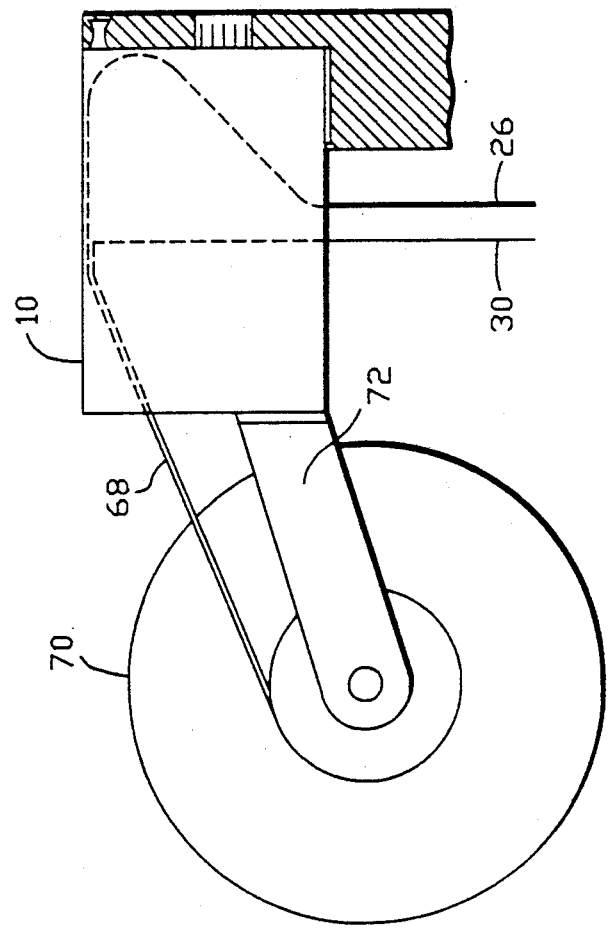

1

FEEDING APPARATUS FOR FEEDING BELTED COMPONENTS TO AN AUTOMATIC ASSEMBLY APPARATUS

BACKGROUND OF THE INVENTION

1. Field of the Invention

The present invention relates to automatic electronic assembly apparatus. More particularly, the present invention relates to an intelligent feeding apparatus for feeding belted components to an automatic assembly apparatus comprising a driving means for the stepwise feeding of the components and means for peeling off the cover tape from the supporting tape of the belt.

2. The Prior Art

In manufacturing electronic circuitry, it is well known in the art to make use of an automatic apparatus picking up electronic components like resistors, capacitors, integrated circuits and the like from a supply, displacing these components to a printed circuit board or to a substrate provided with a conductive pattern and to insert the components into the holes provided in the printed circuit board or to put them onto the substrate. Particularly in the case of surface mounted devices, the components are available in belted form, i.e. they are contained in a plurality of small compartments provided in a supporting tape of the belt. The individual compartments are covered by a cover tape, and the belt is wound up on a reel.

In order that the components may be easily picked up by a suitable picking member, e.g. a suction needle, the tape on the reel must be unwound and fed to a pick up station, and the cover tape must be removed or peeled off to enable the picking member to gain access to the components.

The German Patent No. 34 24 323 A1 discloses a feeding apparatus of the kind mentioned above. Thereby, the driving means is located along side of the guiding means for the belted components, i.e. essentially in a plane running parallel to the vertical plane in which the feeding of the belted components takes place. Thus, this feeding apparatus requires a significant amount of space in a direction perpendicular to the plane in which the feeding of the belted components takes place. However, it is desired that a feeding apparatus of the kind mentioned above be as narrow as possible since, usually, a more than one such feeding apparatus is mounted next to one another in an overall assembly apparatus, forming a feeding station supplying a plurality of different electronic components to a circuit board or other substrate.

This apparatus uses a deviation means for peeling off the cover tape and a driving means for removing the cover tape. Unfortunately, the aforementioned driving means, as well as a reel for winding up the peeled off cover tape, is located above the horizontal plane in which a pick up area is provided where the components are supplied, i.e. where the components are picked up from the compartments by the suction needle of the assembly apparatus. Consequently, the view onto the pick up area is obstructed and a precise alignment of the pick up member to the pick up area is rendered more difficult. Furthermore, a safety clutch is required for the driving of the peeling off means with the consequence that the design of the feeding apparatus is quite complicated and expensive. The empty belts and the peeled off cover tape are transported to places located distantly to each other so that a common automatic removal of this waste is hardly possible.

The German Published Patent Application No. 37 36 563 discloses a feeding apparatus comprising a peeling off means located in the path of movement of the belted components. It includes a peeling off tongue which is directed opposite to the direction of movement of the belted components and engages between the supporting tape and the cover tape of the belt containing the components to be fed in order to separate these two tapes from each other. With this solution, it is necessary that a gap be present between the supporting tape and the cover tape into which the aforementioned tongue can be inserted. Following the tongue, a funnel-shaped deviation member is provided by means of which the peeled off cover tape is deviated from the path of the belted components to a path running parallel thereto. The design of this peeling off means is more complicated without any evident advantage, the threading of the belt containing the components to be fed is very cumbersome and the apparatus is useful only for a limited number of applications.

In addition, prior art component tape feeding apparatus has not had the capability of performing certain functions, such as direct inventory control and automatic feed adjusting capability for adapting to different size components.

OBJECTS OF THE INVENTION

It is an object of the present invention to provide a feeding apparatus for feeding belted components to an automatic component assembly apparatus which does not have the disadvantages of the apparatus known in the prior art.

Particularly, it is an object of the invention to provide a feeding apparatus for feeding belted components to an automatic component assembly apparatus which is narrower than any known apparatus such that more than one feeding apparatus can be used, even in an overall assembly apparatus having only limited space.

It is a still further object of the invention to provide a feeding apparatus for feeding belted components to an automatic component assembly apparatus in which the belt containing the components to be fed can be mounted and threaded very easily and quickly.

It is a still further object of the invention to provide a feeding apparatus for feeding belted components to an automatic component assembly apparatus which has a simple and reliable design due to a minimal number of mechanical parts.

Yet another object of the present invention is to provide a feeding apparatus which has the capability of performing certain automated functions, such as direct inventory control and automatic feed adjusting capability for adapting to different size components.

BRIEF DESCRIPTION OF THE INVENTION

In order to meet these and other objects, a first aspect of the present invention provides a feeding apparatus for feeding belted components to an automatic component assembly apparatus. The feeding apparatus comprises a flat housing mounted on the component insertion apparatus in vertical orientation. The housing includes a guiding channel for guiding the supporting tape of the belt containing the components to be fed. The guiding channel comprises a channel portion running horizontally along the upper narrow edge of the housing and has a freely exposed component pick-up area.

Driving means are provided for stepwise advancement of the belt containing the components to be fed through the guiding channel. The driving means is mounted in the interior of the housing and includes a driving motor.

The apparatus further comprises means for peeling off the cover tape from the belt containing the components to be fed. The driving motor has a drive shaft running parallel to the two lateral surfaces of the housing. A first power transmission mean is fixed to the drive shaft and adapted to stepwise advance the belt containing the components to be fed, and a second power transmission means is fixed to the drive shaft and adapted to advance the cover tape when it is peeled off from the belt containing said components to be fed.

The means for peeling off the cover tape from the belt comprise a deflection means having an oblique deflection edge located in the horizontally running channel portion above the guiding channel. The peeling means further includes a deflection pulley with a horizontally extending rotation shaft.

The cover tape of the belt containing the components to be fed is peeled off from the belt over the deflection edge in horizontal direction and perpendicularly to the forwarding direction of the belt and running over the deflection pulley to be removed in a downward direction.

The design described hereinabove makes possible the realization of the apparatus in a very narrow housing such that a feeding station comprising more than such feeding apparatus can be assembled even if the available space is very limited. Due to the common drive means for forwarding the supporting tape and the cover tape, no safety clutch is required. The driving means are fully integrated into the housing; i.e. no additional means protruding from the housing are required for the operation of the feeding apparatus. The removal of the emptied supporting tape and of the peeled off cover tape can be effected at the same place of the housing; consequently, the automatic disposal of this waste is greatly facilitated. The peeling off means can be used with all kinds of belted components; particularly, no gap between supporting tape and cover tape is required.

In a presently-preferred embodiment, the apparatus comprises a housing which is designed like a cartridge and includes a mounting plate provided with a plurality of recesses and a cover plate partially covering said recesses. Preferably, the housing comprises a channel for the removal of the peeled off cover tape of the belt. The guiding channel for guiding the supporting tape of the belt conveniently opens out at the lower narrow edge of the housing near to the channel for the removal of the peeled off cover tape.

The aforementioned first power transmission means can comprise a pinion gear fixed to the drive shaft of the driving motor, and the driving means for stepwise forwarding the belt further comprises a driving wheel mounted for rotation around a horizontal axis. The driving wheel is provided with a first peripheral gear rim with driving teeth projecting into the guiding channel for guiding the supporting tape of the belt and with a second lateral gear rim meshing with the pinion gear fixed to the drive shaft of the driving motor.

In order to monitor the movement of the driving wheel, the wheel includes a plurality of markings representing the angular position of the driving wheel. An optoelectronic sensing means cooperates with the markings and thereby measures the step length of the forwarding motion of the belt containing the components to be fed.

For the transport of the cover tape to be peeled off, the second power transmission means comprises a driving roll fixed to the drive shaft of the motor in the interior of the aforementioned channel as well as an idler roll pressed against the driving roll, the cover tape peeled off from the belt thereby running between the driving roll and the idler roll to be transported by the rotation of the driving roll.

BRIEF DESCRIPTION OF THE DRAWINGS

In the following, a preferred embodiment of the apparatus according to the invention will be further described, with reference to the accompanying drawings, in which:

FIG. 2 is a top view of the central portion of the feeding apparatus of FIG. 1;

FIG. 3 is a cross-sectional view of the feeding apparatus of FIG. 1 taken along the line III—III in FIG. 1;

FIG. 4 is a general schematic view of the apparatus of the present invention in operation;

DESCRIPTION OF A PREFERRED EMBODIMENT

Figure 1:
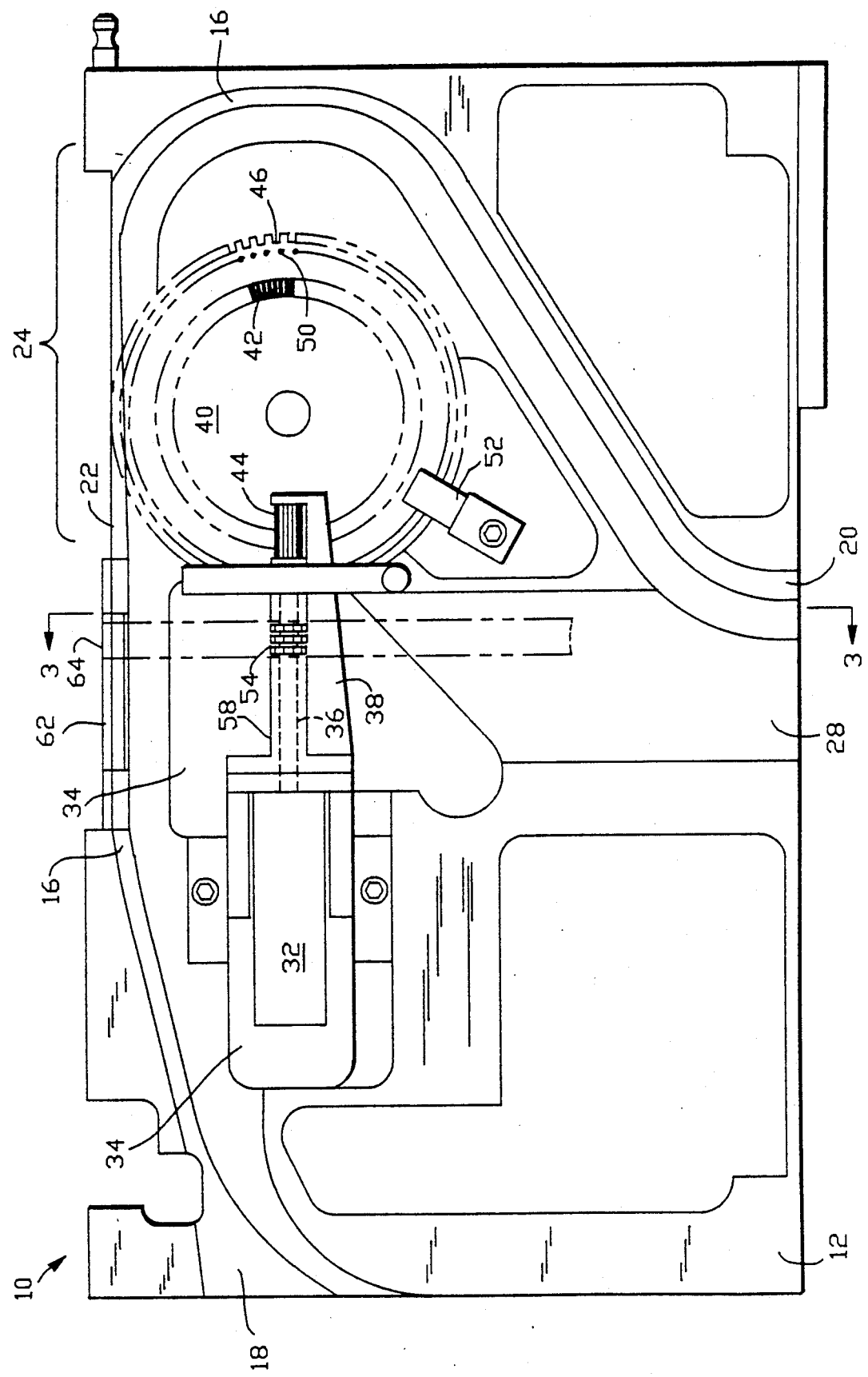
FIG. 1 is a side view of a presently preferred embodiment of the feeding apparatus of the present invention with a cover plate removed.

Referring first to FIG. 1, the feeding apparatus 10 according to a presently preferred embodiment of the invention is shown (with a cover plate of the feeding apparatus removed for clarity) to include a mounting plate 12 which is equipped with different recesses visible in FIG. 1. As can be seen in FIGS. 2 and 3, the recesses in the mounting plate 12 are partially covered by a cover plate 14. The mounting plate 12 together with the cover plate 14 forms a flat cartridge housing. The deepest recess forms a guiding channel 16 for the belted components and the supporting tape thereof, respectively. The guiding channel 16 begins at the left side of the mounting plate 12 shown in FIG. 1 at an inlet opening 18, and ends at the bottom of the mounting plate 12 shown in FIG. 1 at an outlet opening 20 located in the lower narrow edge of the housing comprising mounting plate 12 and cover plate 14. The guiding channel 16 includes a channel portion 22 running horizontally along the upper narrow edge of the housing 12 and cover plate 14. A part of the channel portion 22 has an open top and constitutes a freely exposed pick up area (designated by reference numeral 24) where the components are removed from the tape. i.e. are picked out of the compartments in the supporting tape 26 of the belt by a pick up member of the assembly apparatus (not shown).

A channel 28 is provided approximately in the center of the housing 12 and cover plate 14, through which the cover tape 30 travels after it is peeled off from the supporting tape 26 as it is fed in a downward direction, as shown more clearly in FIG. 4.

A driving motor 32 is located in a recess 34 of the mounting plate 12. The driving motor 32 has a drive shaft 36 running parallel to the two lateral surfaces of the housing 12 and 14 and is received in a support 38 at its free end. In a further recess of the mounting plate 12, a driving wheel 40 is provided which is mounted for rotation around a horizontal axis of rotation. The driving wheel 40 is equipped with a circumferential gear rim 42. A pinion gear 44 is fixed to the drive shaft 36 of the driving motor 32 and meshes with the aforementioned circumferential gear rim 42 of driving wheel 40. Thus, the driving wheel 40 is driven by the driving motor 32 via the drive shaft 36, the pinion gear 44 and the circumferential gear rim 42. The driving wheel 40 is equipped with a peripheral gear rim 46, having a plurality of teeth 48 which protrude into the channel portion 22 of the guiding channel 16 and may thereby engage apertures (not shown) usually provided along the edge of the supporting tape 26 belt containing the components to be fed.

In order to measure the step width of the feeding motion of the belted components, the driving wheel 40 is provided with markings arranged along a lateral circle; in the example shown in FIG. 1, the markings are constituted by apertures 50. An optoelectronic sensing means 52, which may consist of a light emitting diode and photodetector mounted on opposite sides of driving wheel 40, is arranged proximate to driving wheel 40 such that the presence of apertures 50 may be detected. Alternately, as is well known in the art, a plurality of bars which are optically scanned may be provided in place of apertures 50. In addition, the teeth 48 of the peripheral gear rim 46 can be optically or electrically scanned. Thus, the incremental motion of the belt containing the components to be fed can be adjusted according to the longitudinal extension of the components contained in the individual compartments in a very fine increments.

Referring to FIGS. 2 and 3, a central portion of the feeding apparatus in a top view and a cross sectional view along the line III—III in FIG. 1 of the apparatus of the present invention, a means for peeling the cover tape 30 off of the supporting tape 26 may comprise a further power transmission means in the form of a pinion gear 54 fixed to the same drive shaft 36 of the driving motor 32. The pinion gear 54 co-operates with an idler roll pressed against the pinion gear 54. In the presently preferred embodiment disclosed herein, the idler roll may be a pinion gear 56 (shown in relationship in FIG. 3). Pinion gear 56 is mounted on a shaft which may be received in a support member 58 which is pivotally mounted from an operating position in which it is kept in position by a locking lever and pressed against the pinion gear 54 into a rest position away from the pinion gear 54 to facilitate the insertion of the cover tape 30 between the pinion gears 54 and 56.

For peeling off the cover tape 30 adhering to the supporting tape 26, a deviation means is provided comprising a leaf-like plate 62 having an oblique deviation edge 64 and located above the guiding channel 16 in the pick up area 24, as well as a deviation roll 66 rotatable around a horizontally extending axis. The cover tape 30 is peeled off from the supporting tape 26 by running over the oblique deviation edge 64 in a horizontal direction perpendicular to the path of movement of the belted components and then over the deviation roll 66 downwards into the channel 28.

As can be seen in FIGS. 2 and 3, the total width of the feeding apparatus transverse to the path of motion of the belted components is quite narrow and is defined only by the width of the belt guiding means.

Referring now to FIG. 4, a composite component tape 68 containing the belted components (comprising both supporting tape 26 and cover tape 30) can be supplied, as shown for example in FIG. 4 from a supply reel 70 connected to the feeding apparatus 10 by means of a supporting arm 72.

Figure 5:
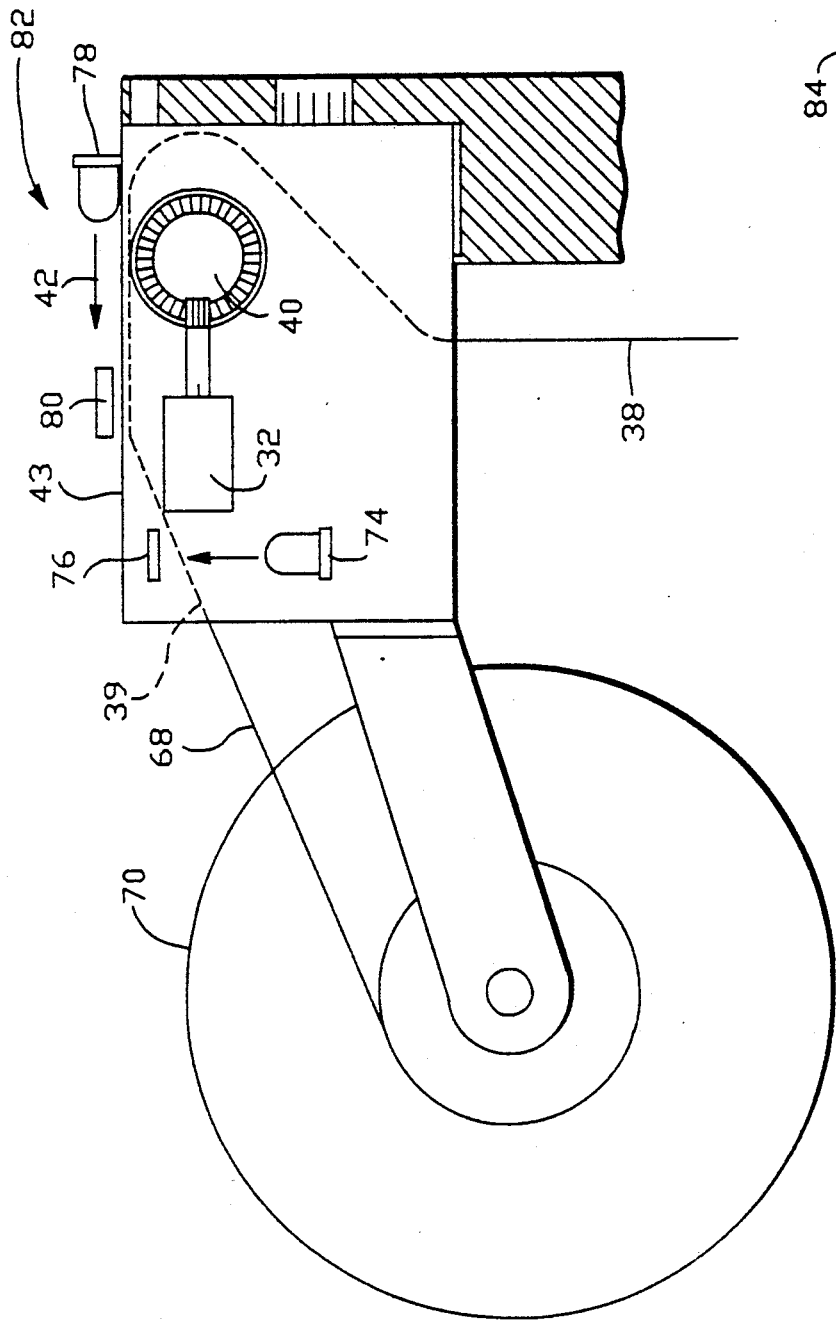
FIG. 5 is a general schematic view of the apparatus of the present invention including presently preferred optoelectronic sensors for use with the intelligent portion of the apparatus.

Referring now to FIG. 5, sensor means for the control electronics associated with the present invention are disclosed. As shown in FIG. 5, presence of the composite component tape 68, guided into the channel 16 at the aperture 18, may be detected by an opto-electric sensor arrangement comprising an infrared (IR) light emitting diode (LED) 74 and an IR photodetector 76. The IR LED 74 projects an infrared light beam upwards through the composite component tape 68. When the composite component tape 68 is present, this light beam is blocked and is thus not received by the IR photodetector 76. In the event that the tape breaks or runs out, the light beam is received by the IR photodetector. This condition is sensed by the intelligent controller and an "End-of-Tape" alarm is activated. When the apparatus of the present invention is supplied with a new composite component tape 68 containing components, the light beam will again be broken and the alarm will be deactivated.

As also shown in FIG. 5, a presently preferred embodiment of the present invention includes an infrared (IR) light emitting diode (LED) 78 and an IR photodetector 80. The IR LED 78 projects an infrared light beam to the IR photodetector 80 across the tape feeder pick position 82. When a pick-up nozzle enters area 82 between IR LED 78 and photodetector 80, it interrupts the light beam between IR LED 78 and photodetector 80 and is thus detected. When the pick-up nozzle leaves area 82, the light beam is again received by the IR photodetector 80 and this event is registered by a microcontroller, which initiates a machine routine to start the motor 32, thus advancing composite component tape 68 by a predetermined pitch.

Figure 6:
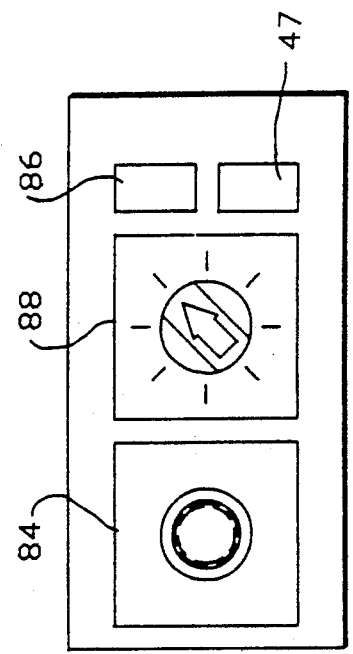
FIG. 6 is a general schematic view of a control panel used in the present invention, showing selected switches and indicator lights.

Referring now to FIG. 6, the composite component tape 68 may also be advanced manually by use of a manual pushbutton 84, located on a control panel located at a convenient place on the apparatus. The "End of Tape" alarm may comprise an LED 86, also shown on the control panel. The advance pitch of the tape may be predetermined by setting a programmable advance switch 88 on the control panel.

Figure 7:
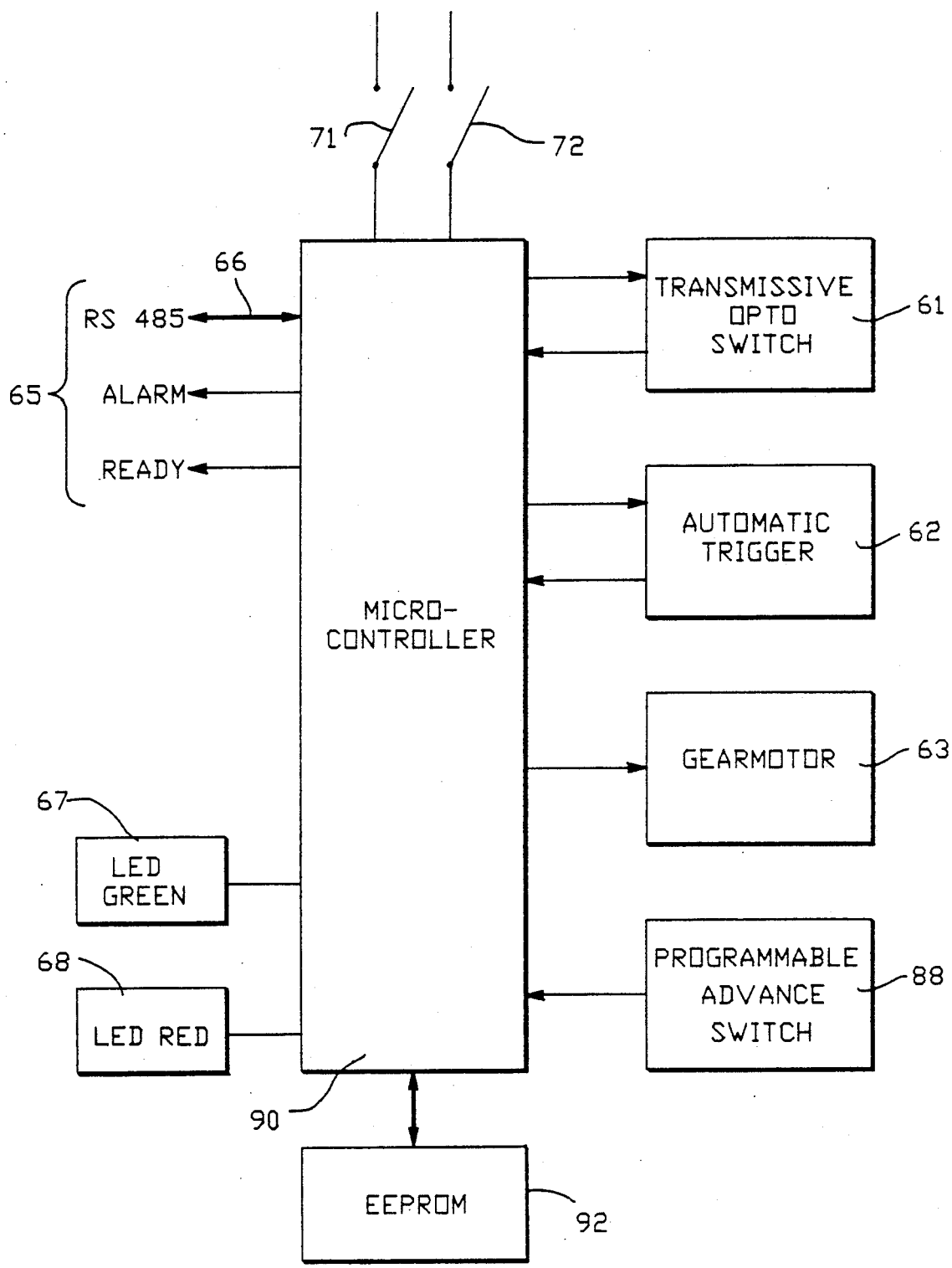
FIG. 7 is a block diagram of the microcontroller hardware used in a presently-preferred embodiment of the invention.

Referring to FIG. 7, a simplified schematic/block diagram of a presently preferred control system of the apparatus of the present invention is shown. The control system includes a microcontroller 90, connected via a conventional bus to EEPROM 92. The output of optoelectronic sensing means 52, which senses the apertures 50 on driving wheel 40, is connected to an I/O port of microcontroller 90, as are photodetector 80, which senses the presence of the pickup nozzle, and photodetector 76, which is the "End of Tape" sensor. Programmable advance switch 88, for preprogramming the incremental tape advancement, and manual pushbutton 84, for providing manual advance of the tape, are also connected to an I/O port of microcontroller 90. Microcontroller 90 is also used to control the drive of motor 32 in a manner well known in the art.

Microcontroller 90 is responsive to input and output signals from the apparatus depicted in FIGS. 1-6. The software may reside permanently in the ROM area of the microcontroller 90 as is well known in the art, and acts in cooperation with the hardware disclosed herein to position the supply tape, perform an automatic trigger function, interface with an RS-485 communications system, perform alarm handling, and save data relating to the component supply and other data related to the feeder.

The operational sequence of microcontroller 90 may be most clearly seen with reference to FIGS. 8-13, which are flow diagrams of the operational sequence of the apparatus in a presently preferred embodiment.

Figure 8:
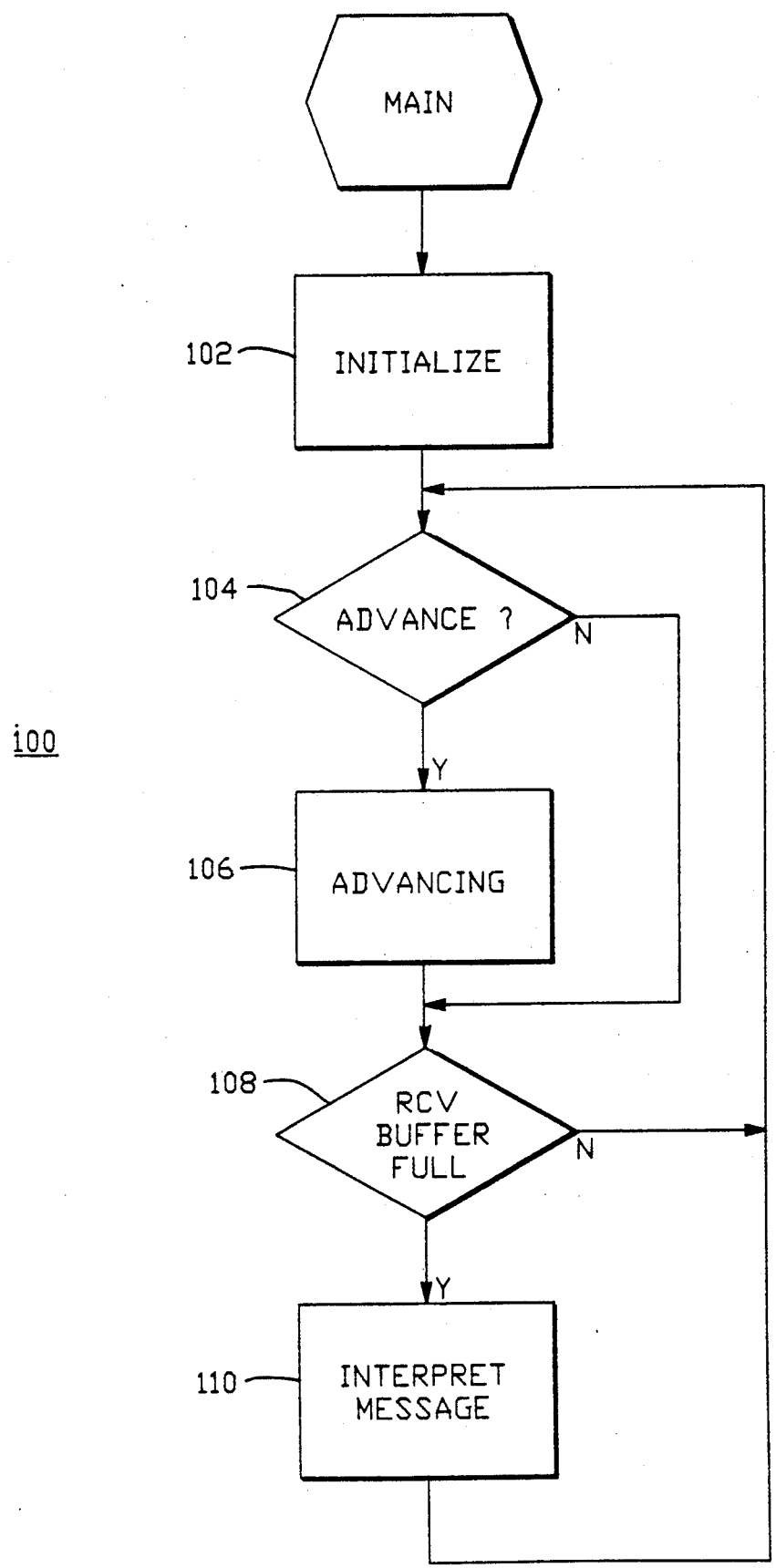
FIG. 8 is a flow diagram of the main routine machine loop executed by a presently preferred embodiment of the present invention.

Referring first to FIG. 8, a flow diagram is shown of the main machine loop 100 executed by a presently preferred embodiment of the present invention. In a first step 102, the microcomputer 90 is initialized. The initialization routine will be more clearly disclosed with reference to FIG. 9. Next, at step 104, it is determined whether the apparatus of the present invention is ready to advance the component-bearing tape. When the microcontroller has registered the end of the interruption of the light beam between infrared LED 40 and photodetector 41, indicating that the pick-up nozzle has left the area 42 between the IR LED 40 and photodetector 41, the apparatus is prepared to advance. In addition, depression of the manual advance pushbutton 84 (FIG. 6) also indicates an advance. At step 104 it is decided whether either of these events have occurred. If one of these events has occurred, an advancing routine is initiated at step 106. The advancing routine is shown more clearly with reference to FIG. 10. If the advancing routine is not requested, it is skipped as shown in FIG. 8.

Next, at step 108, it is determined whether the receive buffer is full. The receive buffer is a location which stores a character which may be sent to the system from an external source via an RS-485 communications loop. If the receive buffer is full the routine moves to step 110 which executes an interpret message routine to interpret message which has been sent to the buffer. After the message has been interpreted the main machine returns to step 104. If the receive buffer was not full the routine also returns to step 104.

Figure 9:
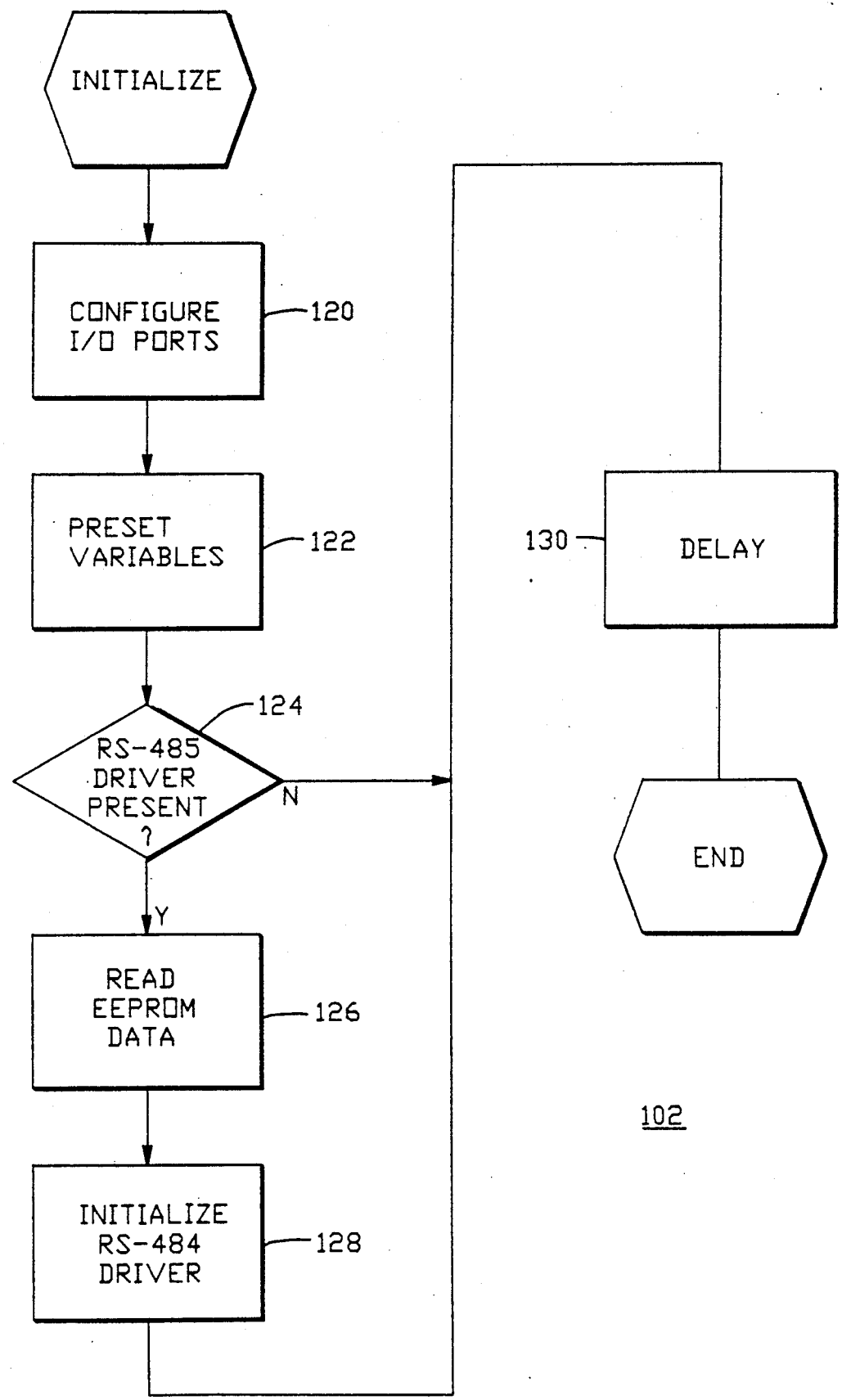
FIG. 9 is a flow diagram of the initialize machine subroutine executed by a presently preferred embodiment of the present invention.

Referring now to FIG. 9, the initialize routine 102 is described. First, at step 120, the I/O ports of the microcontroller are defined as input or output ports. For instance, the lines to the indicator LED's are configured as output ports. The RS-485 interface is defined as is well known in the art. Next, at step 122, all variables are preset. In this step the status of all motors is preset to inactive, and all variables with known values are set to user selected values which will depend on the particular application as well as other conditions peculiar to individual users. The inventory and consumption counters are loaded from the EEPROM 92. In addition, all registers are set to zero and other well known housekeeping tasks common to initialization routines are performed.

Next, at step 124, it is determined whether an RS-485 communications link is present in the configuration. If so, at step 126, stored data from an EEPROM relating to known parameters about the feeder, such as the feeder type, the component type, the component pitch on the tape, number of components consumed, number of components in stock are read from the EEPROM.

Next, at step 128 the RS-484 driver is initialed by preconfiguring the certain messages such as feeder type, component type and pitch for sending over the link.

Next, at delay step 130, a three second delay is interposed to give the system which is hierarchically located above the tape feeder system to achieve setup time. If, at step 124, it is determined that an RS-485 communication system is not present the routine proceeds immediately to step 130. Step 130 is the final step in the initialization routine.

Figure 10:
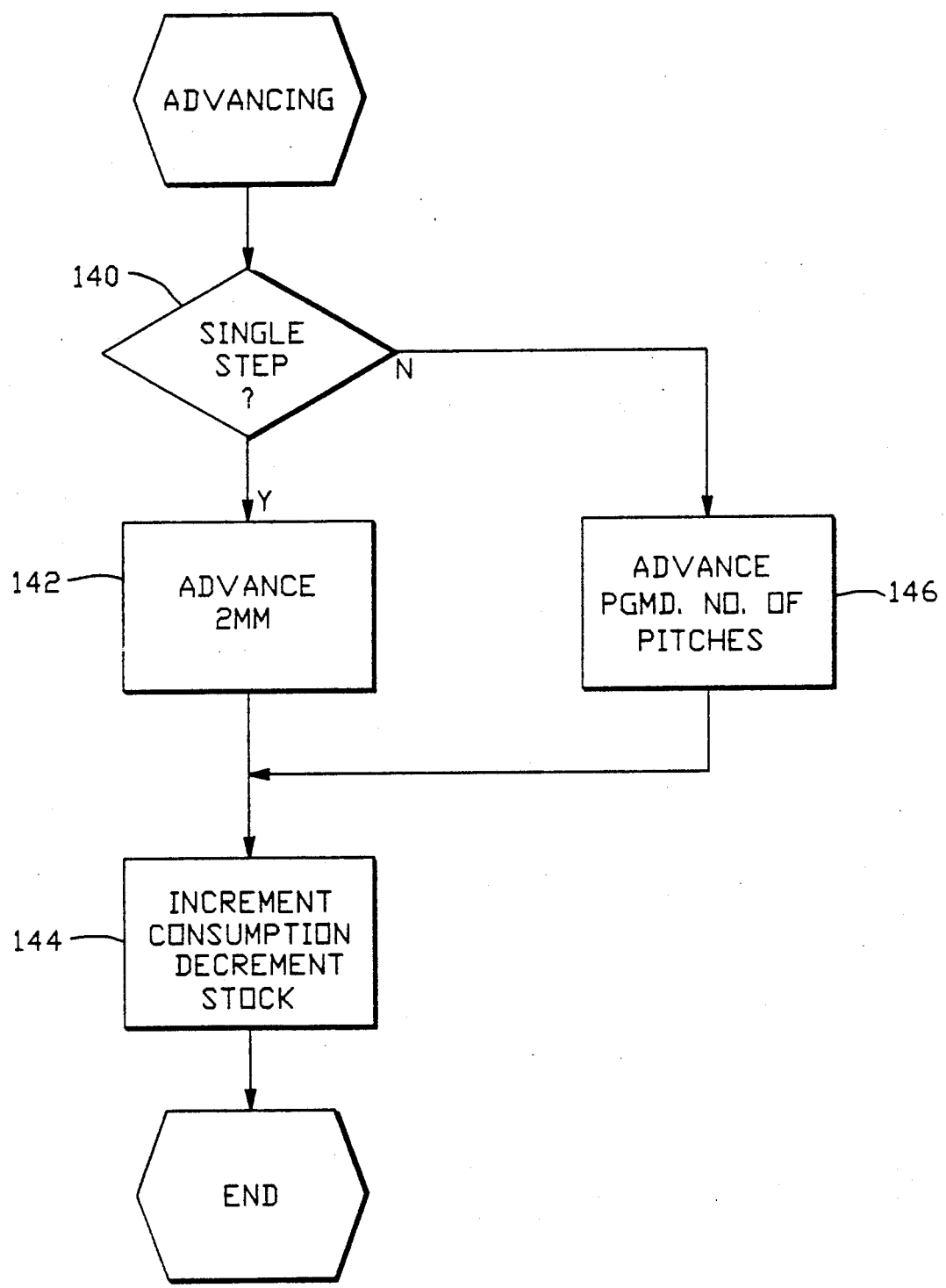
FIG. 10 is a flow diagram of the advancing machine subroutine executed by a presently preferred embodiment of the present invention.

Referring now to FIG. 10, the advancing routine used in a presently-preferred embodiment of the present invention is disclosed.

First, at step 140, it is decided whether the feeder apparatus is in single step or multi-step mode. If it has been determined that the feeder is in single step mode, at step 142 the feeder mechanism is advanced two millimeters. While two millimeters has been chosen as the nominal single step advance space, those of ordinary skill in the art will recognize that other advance pitches could be used as the standard, depending on the components most likely used or the spacing found on component tapes. Next, at step 144, the consumption count is incremented and the stock count is decremented. Step 144 allows the apparatus of the present invention to perform an inventory control function. The contents of the consumption counter and stock counter may be interrogated by the system or, via the RS-485 loop by a larger system of which the feeder apparatus is a part.

If, at step 140, it has been determined that the feeder is not in single step mode, at step 146 the feeder mechanism is advanced a preprogrammed number of pitches. This preprogrammed number of pitches may be stored at a hardware or software location in the microcontroller 70, as is well known in the art. As may be easily seen from FIG. 10, step 144 occurs regardless of the pitch of the advance mechanism. The advancing routine ends after step 144.

Figure 11:
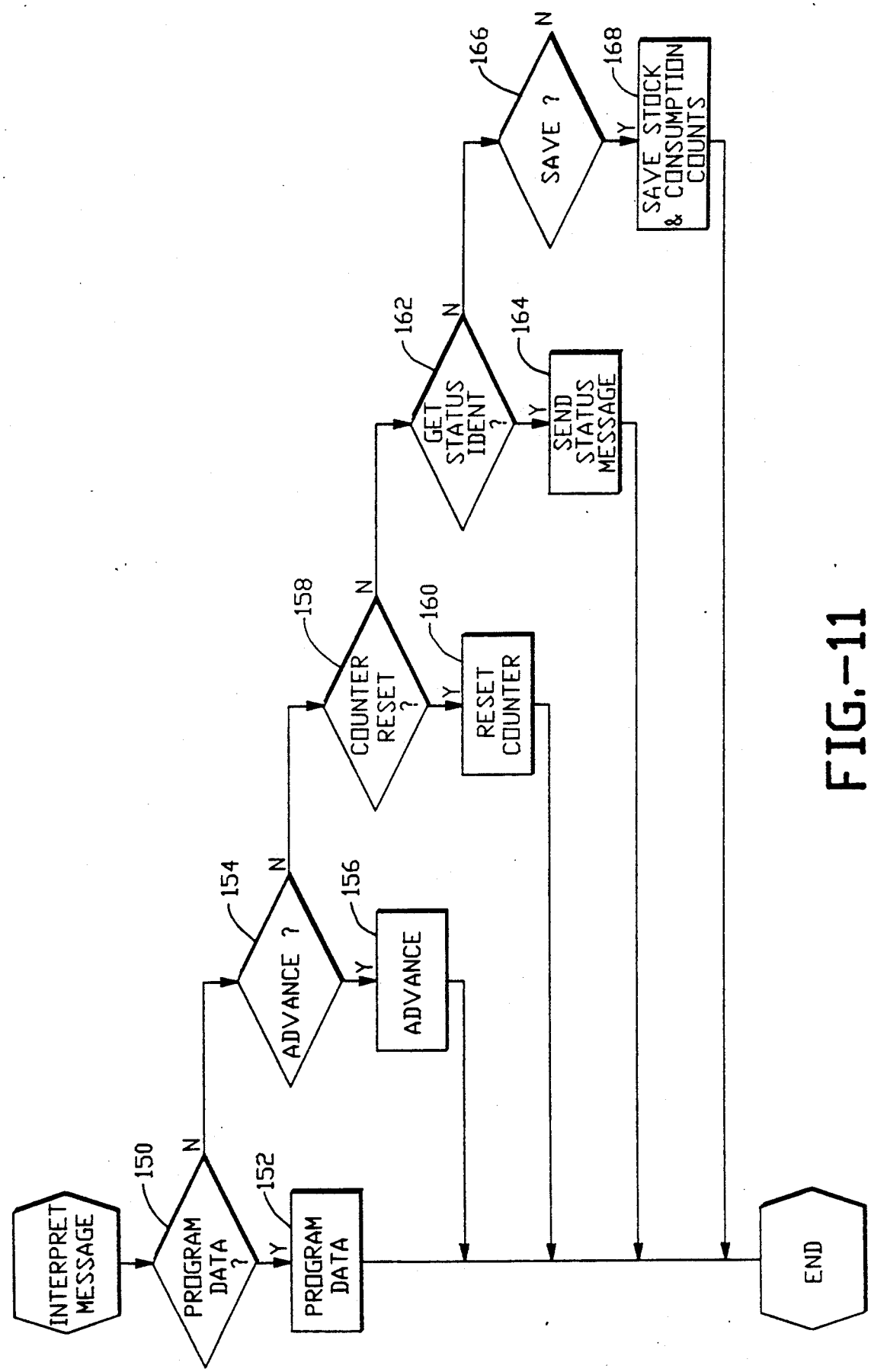
FIG. 11 is a flow diagram of the interpret message machine subroutine executed by a presently preferred embodiment of the present invention.

Referring now to FIG. 11, the interpret message subroutine will be disclosed. The interpret message routine determines the type of message which has been received over the RS-485 communications loop and performs one or more actions in accordance with the message contents. First, at step 150, it is determined whether the message is an instruction to program data into the EEPROM. If so, at step 152, microcontroller 70 programs the received data into the EEPROM.

If it is determined that the message is not a request to program data, it is determined at step 154 whether the message is an instruction to advance. If the message is an instruction to advance, the advance routine is executed at step 156. If it is determined that the instruction is not an instruction to advance the feeder, at 158 it is determined if the message is an instruction to reset one or more of the counters. If so, at step 160, the chosen counter is reset. If it is determined that the message is not an instruction to reset a counter, it is determined at stp 162 whether the message is a request for the status of the feeder. If so, at step 164 a status message is sent containing the feeder type, component identification, pitch, stock and compensation count and alarm status. If it is determined that the message is not a status request, it is determined at step 166 whether the received message is a request to save the stock and consumption counts in the EEPROM. If it is such a request, at step 168, the current stock and consumption counts are saved in the EEPROM.

Figure 12:
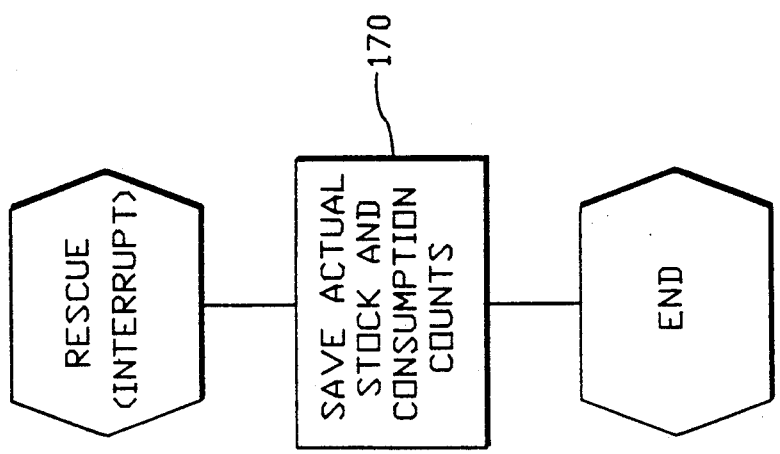
FIG. 12 is a flow diagram of the rescue message machine subroutine executed by a presently preferred embodiment of the present invention.

Referring now to FIG. 12, the rescue subroutine will be described. The consumption and stock counts are stored in volatile media, and provision is made in the present invention for saving these counts when power to the apparatus is turned off or interrupted. When power disconnect is sensed, the rescue subroutine, at its single step 170, saves the consumption and stock counts in EEPROM 92.

Figure 13:
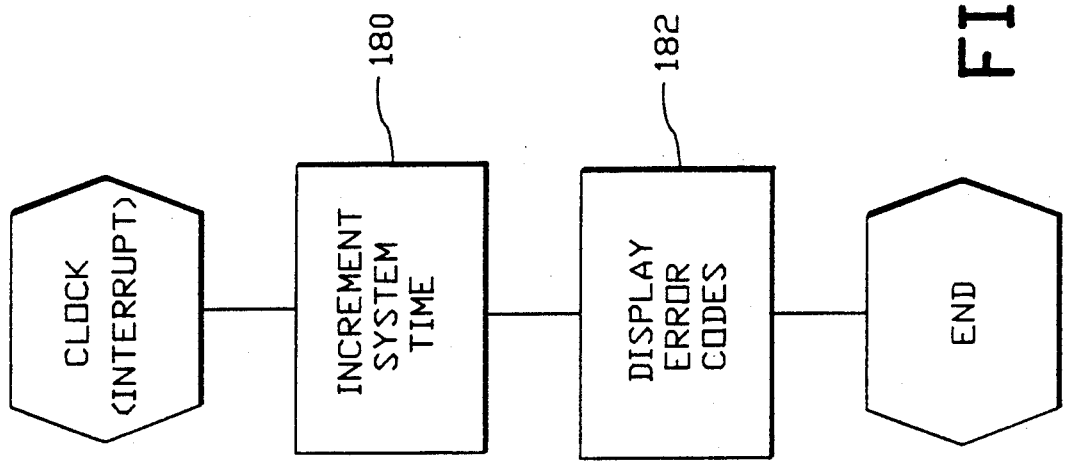
FIG. 13 is a flow diagram of the clock machine subroutine executed by a presently preferred embodiment of the present invention.

Referring now to FIG. 13, the clock subroutine will be described. This routine is interrupt driven, and, in a presently preferred embodiment, executes every 130 msec when a counter driven by a clock activates a hardware interrupt pin of microcontroller 90. First, at step 180, a system time counter is incremented. Next, at step 182, any current error conditions are displayed. Such conditions include: consumption count equals inventory count, end of tape sensed, no motor rotation after timeout. These conditions may be indicated by, for example, individual LEDs, or different flashing rates on a single error LED. The error LEDs may be driven from microcontroller 90 in a manner well known in the art.

While a presently-preferred embodiment of the invention has been disclosed, those of ordinary skill in the art will, from an examination of the within disclosure and drawings be able to configure other embodiments of the invention. These other embodiments are intended to fall within the scope of the present invention which is to be limited only by the scope of the appended claims.

What we claim is:

1. A feeding apparatus for feeding components supported on a belt and packaged in a cover tape to an automatic component assembly means, including a component insertion apparatus, said feeding apparatus comprising:

a flat housing having at least two lateral surfaces mounted on said component insertion apparatus in vertical orientation including a guiding channel for guiding the belt containing the components to be fed, said guiding channel comprising a channel portion running horizontally along an upper edge of said housing and having a freely exposed component pick-up area;

driving means for stepwise forwarding said belt containing said components to be fed through said guiding channel, said driving means mounted in the interior of said housing and including a driving motor;

means for peeling off the cover tape from said belt containing said components to be fed;

said driving motor comprising a drive shaft running parallel to the lateral surfaces of said housing;

a first power transmission means fixed to said drive shaft and adapted to stepwise forward said belt;

a second power transmission means fixed to said drive shaft and adapted to forward said cover tape when it is peeled off from said belt containing said components to be fed;

said means for peeling off said cover tape comprising a deflection means having an oblique deflection edge located in said horizontally running portion of said guiding channel, and further having a deflection pulley with a horizontally extending rotation shaft;

said cover tape of said belt containing said components to be fed being peeled off from said belt over said deflection edge in a horizontal direction and perpendicularly to the forwarding direction of said belt and running over said deflection pulley to be removed in a downward direction.

2. A feeding apparatus according to claim 1 in which said housing defines a cartridge and comprises a mounted plate provided with a plurality of recesses and a cover plate partially covering said recesses.

3. A feeding apparatus according to claim 1 in which said housing comprises a channel for the removal of said peeled off cover tape of said belt, and in which said guiding channel for guiding said supporting tape of said belt opens out at a lower edge of said housing near to said channel for the removal of said peeled off cover tape.

4. A feeding apparatus according to claim 1 in which said first power transmission means comprises a pinion gear fixed to said drive shaft of said driving motor, said driving means for stepwise forwarding said belt further comprising a driving wheel mounted for rotation around a horizontal axis, said driving wheel being provided with a first peripheral gear rim with driving teeth projecting into said guiding channel for guiding the supporting tape of said belt and with a second lateral gear rim meshing with said pinion gear fixed to said drive shaft of said driving motor.

5. A feeding apparatus according to claim 4 in which said driving wheel comprises a plurality of markings representing the angular position of said driving wheel, said apparatus further comprising an optoelectronic sensing means cooperating with said markings and thereby measuring the step length of the forwarding motion of said belt containing said components to be fed.

6. A feeding apparatus according to claim 1 in which said housing comprises a channel for the removal of said peeled off cover tape of said belt, in which said drive shaft of said driving motor extends through said channel, and in which said second power transmission means comprises a driving roll fixed to said drive shaft of said driving motor in the interior of said channel as well as an idler roll pressed against said driving roll, said cover tape peeled off from said belt containing said components running between said driving roll and said idler roll to be transported by the rotation of said driving roll.

* * * * *